(12) United States Patent
Shibata

(10) Patent No.: US 7,057,294 B2
(45) Date of Patent: Jun. 6, 2006

(54) SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 53 days.

(21) Appl. No.: 10/193,328

(22) Filed: Jul. 12, 2002

(65) Prior Publication Data
US 2003/0011069 A1 Jan. 16, 2003

(30) Foreign Application Priority Data
Jul. 13, 2001 (JP) .............................. 2001-214205

(51) Int. Cl.
*H01L 21/00* (2006.01)
(52) U.S. Cl. .................. 257/781; 257/782; 257/783
(58) Field of Classification Search ............... 257/678, 257/666, 737, 668, 667, 679, 781, 682, 778, 257/767, 787, 672, 690, 684, 700, 713, 723, 257/724, 780, 782, 783
See application file for complete search history.

(56) References Cited

U.S. PATENT DOCUMENTS

| | | | | |
|---|---|---|---|---|
| 4,991,001 A | * | 2/1991 | Takubo et al. ............... | 257/668 |
| 5,220,486 A | * | 6/1993 | Takubo et al. ............... | 257/666 |
| 5,300,811 A | * | 4/1994 | Suzuki et al. ................ | 257/691 |
| 5,317,438 A | * | 5/1994 | Suzuki et al. ................ | 349/192 |
| 5,434,452 A | * | 7/1995 | Higgins, III ................. | 257/773 |
| 5,461,261 A | * | 10/1995 | Nishiguchi .................. | 257/781 |
| 5,604,379 A | * | 2/1997 | Mori .......................... | 257/738 |
| 5,775,569 A | * | 7/1998 | Berger et al. ................ | 228/254 |
| 5,969,426 A | * | 10/1999 | Baba et al. .................. | 257/666 |
| 6,046,071 A | * | 4/2000 | Sawai et al. ................. | 438/106 |
| 6,104,091 A | * | 8/2000 | Ito et al. ...................... | 257/738 |
| 6,143,991 A | * | 11/2000 | Moriyama ................... | 174/261 |
| 6,204,564 B1 | * | 3/2001 | Miyata et al. ............... | 257/737 |
| 6,445,064 B1 | * | 9/2002 | Ishii et al. ................... | 257/666 |
| 6,489,687 B1 | * | 12/2002 | Hashimoto ................... | 257/777 |
| 6,517,698 B1 | * | 2/2003 | Johnson et al. .............. | 205/148 |

FOREIGN PATENT DOCUMENTS

| | | | | |
|---|---|---|---|---|
| JP | 09-213702 | | 8/1997 | |
| JP | 2000306948 | * | 11/2000 | .................... 21/60 |
| JP | 2001-085595 | | 3/2001 | |
| JP | 2002110851 | * | 4/2002 | .................... 23/12 |

OTHER PUBLICATIONS

Office Action; document No.: 02-00283.

* cited by examiner

*Primary Examiner*—Laura M. Schillinger
(74) *Attorney, Agent, or Firm*—Rader, Fishman & Grauer PLLC

(57) ABSTRACT

Circuit elements are formed in a semiconductor chip (1) and an electrode pad (11) for connection with outside is formed on the periphery of a surface of the semiconductor chip (1). On the other hand, a wiring (21) is formed on one surface of an insulating substrate (2) and an external connecting terminal (22) is formed on the other surface thereof, being connected to the wiring (21). The electrode pad (11) of the semiconductor chip (1) and the wiring (21) are bonded by an Au—Sn alloy layer (3) at the connection section thereof. As a result, there is obtained a semiconductor device of a CSP type with a structure capable of connecting the semiconductor chip and the insulating substrate to each other without applying a large pressure and a high temperature thereto, and forming a circuit element even below the electrode pad and in the vicinity thereof to enable high integration.

8 Claims, 2 Drawing Sheets

SEMICONDUCTOR DEVICE

FIELD OF THE INVENTION

The present invention relates to a semiconductor device in which a semiconductor chip is connected to an insulating substrate to distribute electrode pads provided along the periphery of the semiconductor chip over the area of the semiconductor chip. More particularly, the present invention relates to a semiconductor device having a structure capable of certainly connecting therebetween without short-circuiting between electrodes pads adjacent to each other even in a condition that a temperature of a semiconductor chip is not raised so high or that the semiconductor chip is not pressed at a high pressure.

BACKGROUND OF THE INVENTION

Conventionally, A semiconductor chip such as IC or LSI has been fabricated in the following structure in which circuit elements is formed in a semiconductor layer so as to form a circuit, and electrode terminals for connection with an external circuit are led out to the periphery of the semiconductor chip as electrode pads such that the electrode pads can be connected to external leads by means of wire bonding or the like. Recently, a configuration has been adopted in which bump electrodes are formed on respective electrode pads and the bump electrodes are connected directly to corresponding terminals, leads or the like without using wire bonding from the viewpoints of down-sizing of electronic parts, labor-saving in assembly thereof, and the like. Progresses to high integration and to complexity of a semiconductor chip, however, have been accompanied by a tremendous increase in the number of electrode pads with a very narrow gap between adjacent electrode pads, and when direct connection of bump electrodes are tried using an adhesive or the like, there arise problems that adjacent electrode pads are short-circuited therebetween and that an element formed on a semiconductor chip receives an adverse influence by a temperature rise and a high pressure in adhesion.

On the other hand, in a case where a semiconductor chip is mounted, there is a free space in a center side area adjacent to the outer peripheral section on which electrode pads of the semiconductor chip are formed. Therefore, in order to effectively use the free space, a semiconductor device called a chip size package (CSP) has been put into practice in which as shown in FIG. 3, a wiring 21 aligned in position with a bump electrode 12 on an electrode pad 11 of a semiconductor chip 1 is formed on one surface of an insulating film (substrate) 2 made of polyimide or the like, while on the other surface of the insulating film 2, there are formed external connecting terminals 22 in distribution all over the surface, connected to the wiring 21.

Connection between the semiconductor chip 1 and the insulating film 2 are achieved in such a way that, for example, an anisotropic conductive adhesive (ACF) 8 is applied on the wiring 21 of the insulating film 2 and by pressing the semiconductor chip 1 to the insulating film 2, the anisotropic conductive adhesive 8 is pushed out sideways around a protrusion of the bump electrode 12 while at the bump electrode 12 itself, the conductive particles 81 are sandwiched by the bump electrode 12 and the wiring 21, to thereby establishing electrical connection between the bump electrode 12 and the wiring 21 via the conductive particles 81. On the other hand, in the lateral direction, conduction is cut off so as not to establish electrical connection since the anisotropic conductive adhesive 8 is in a state where the conductive particles 81 and the adhesive are mixed with each other. Therefore, no short-circuit occurs between adjacent electrode terminals even if a gap therebetween is narrow, thereby enabling connection only between an electrode terminal and a wiring, facing to each other.

In a semiconductor device of a CSP type in which as described above, a semiconductor chip and an insulating film are caused to adhere to each other, adhesion between both are realized with an anisotropic conductive adhesive. In adhesion using an anisotropic conductive adhesive, a process is required in which heating is performed for a long period of the order of 20 seconds while pressure contact is imposed therebetween at a value of the order in the range of from 20 to 50 g per each bump during adhesion. If such a pressure is applied for a long period in a adhesion process, not only is productivity lowered, but the pressure also acts directly onto a semiconductor layer below an electrode pad, leading to a problem of causing an abnormaly in a circuit element (semiconductor element) formed in the semiconductor layer. Therefore, the element cannot be formed below the electrode pad and therearound, resulting in a problem of being unable to fabricate a highly integrated semiconductor chip of a light weight, a thin thickness and a small size.

SUMMARY OF THE INVENTION

The present invention has been made in light of such circumstances and it is an object of the present invention to provide a semiconductor device of a CSP type with a structure capable of connecting a semiconductor chip and an insulating substrate therebetween without applying a large pressure for a long period to improve productivity, and forming a circuit element even below an electrode pad and in the vicinity thereof to enable high integration.

A semiconductor device according to the present invention includes: a semiconductor chip in which circuit elements are formed and on the periphery of which an electrode pad for connection with outside is formed; and an insulating substrate on one surface of which a wiring is formed and on the other surface of which an external connecting terminal is formed being connected to the wiring, wherein connection section of the electrode pad and the wiring are bonded with each other with an Au—Sn alloy layer inserted therebetween.

The circuit elements herein means an elements such as semiconductor elements constituting an integrated circuit, formed in a semiconductor layer or between the semiconductor layer and an interlayer insulating layer, including a transistor, a diode, a capacitor and others. Furthermore, the insulating substrate, as the sense of the term, includes a flexible film such as polyimide in addition to a difficult-to-be-bent, hard substrate.

With such a structure adopted, only by raising a temperature of the semiconductor chip and the insulating substrate to a value of the order in the range of from 280° C. to 300° C., Sn is molten and Au diffuses into Sn, so that an Au—Sn eutectic alloy is formed as an alloy layer to enable attachment to each other through melting in a period of the order of 1 sec, that is, a period of the order ½₀ times that in a case where a conventional ACF is adopted. As a result, not only is productivity considerably improved, but it becomes unnecessary to apply a high pressure exerting an adverse influence on circuit elements for a long period either, resulting in no adverse influence on circuit elements to be caused by a pressure. In addition, since the wiring other than the bonding section is made of a high melting point Au, absolutely no inconvenience is produced in mounting by an influence of a soldering temperature in the process.

To be concrete, a bump made of Au is formed on a surface of the electrode pad of the semiconductor chip, an Sn coat is provided on a surface of the bump or on an Au layer provided on a surface of the wiring, and the bump and the wiring are bonded by an alloy layer made of the Sn coat and Au of the bump, thus forming an eutectic alloy with Au of the bump and the Sn coat provided on the wiring surface to attach them to each other.

It is preferable in an aspect of control of metal diffusion to provide the Sn coat on the only bonding section of the wiring in a spot manner since no alloy is formed on other parts of the wiring than the bonding section.

A package may be formed to cover the semiconductor chip on the insulating substrate, which is made of resin.

DETAILED DESCRIPTION

Figure 1A:
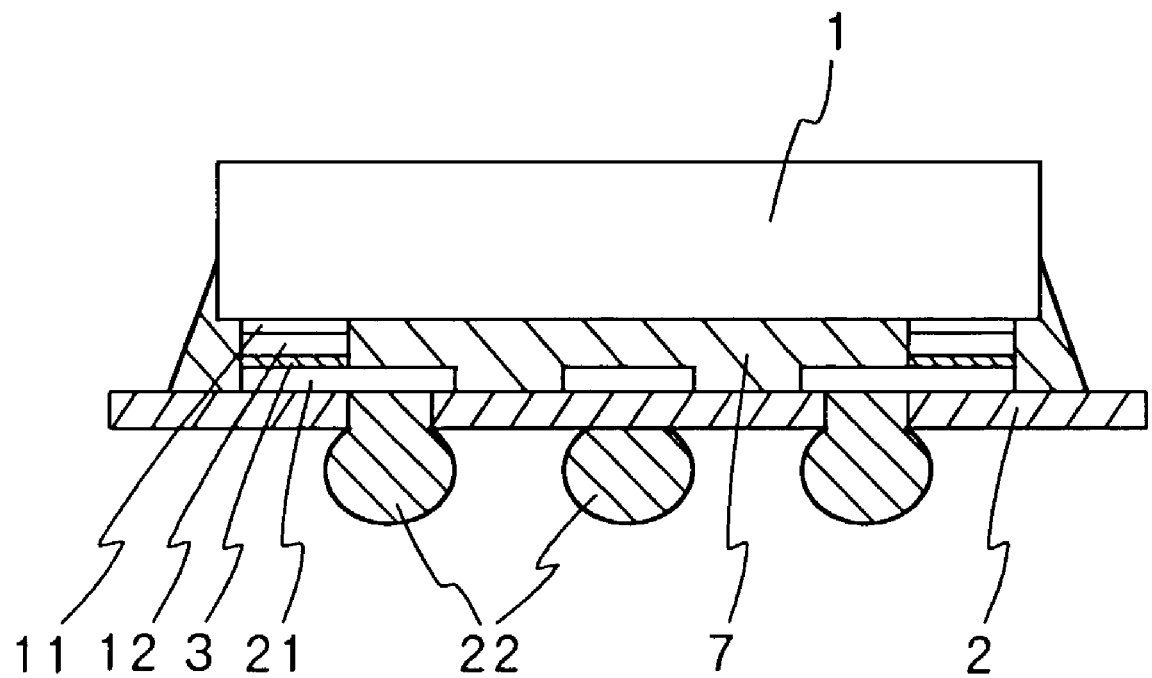
FIGS. 1A and 1B are a sectional view for description showing one embodiment of a semiconductor device according to the present invention and a partially enlarged view for description of a bump and a wiring prior to bonding, respectively.

Description will be given of a semiconductor device of the present invention with reference to the accompanying drawings. A semiconductor device according to the present invention, which is shown as a sectional view for description of one embodiment thereof in FIG. 1A, includes a semiconductor chip 1 and an insulating substrate 2. Circuit elements (semiconductor elements) are formed in the semiconductor chip 1 and an electrode pad for connection with outside is formed on the periphery of a surface of the semiconductor chip 1. On the other hand, a wiring 21 is formed on one surface of the insulating substrate 2 and an external connecting terminal 22 is formed on the other surface thereof, connected to the wiring 21. The feature is that the electrode pad 11 of the semiconductor chip 1 and the wiring 21 are bonded by an Au—Sn alloy layer 3 at the connection section thereof.

Figure 1B:
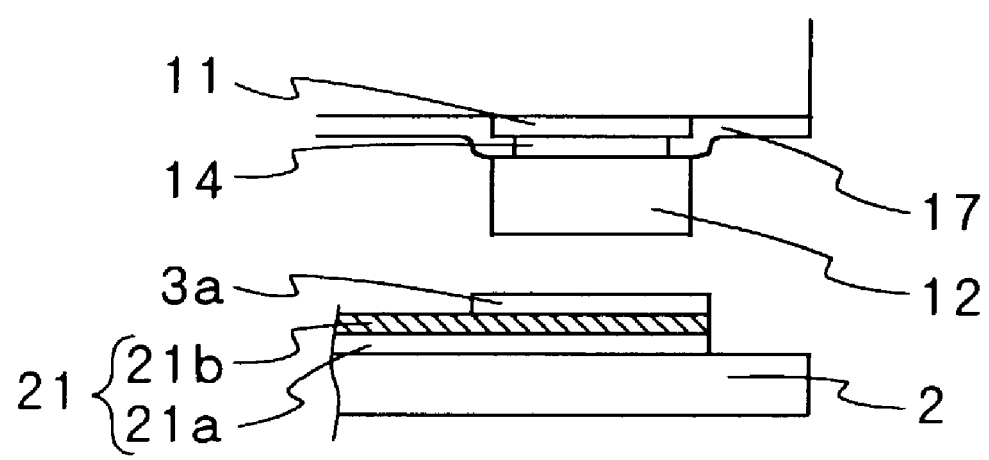

In the example shown in FIG. 1, a bump (electrode) 12 is formed by plating or the like technique on a surface of the electrode pad 11 for connection with outside the semiconductor chip 1 to a thickness of the order in the range of from 10 to 30 μm. The bump 12 itself is formed according to a conventional practice and formed, for example, as shown in a partially enlarged view of the bonding section prior to bonding of FIG. 1B, in such a manner that an intermediate metal layer 14 with a two or three layer structure is formed on the electrode terminal 11 made of Al or the like metal, for example Ti or Cr is used as material of a first layer of the intermediate metal layer 14; W, Pt, Ag, Cu, Ni or the like as material of a second layer thereof; and Au or the like as material of a third layer thereof. In another example, the intermediate metal layer 14 includes a first layer made of Ti—W alloy or the like and a second layer made of Au or the like. The bump 12 is formed thereon with Au, Cu or the like. Note that a reference numeral 17 indicates an insulating film. Circuit elements (semiconductor elements), and a wiring, an electrode pad, an insulating film and others formed on a surface of a semiconductor substrate are fabricated in a similar way to that in a fabrication process of an ordinary semiconductor device.

While the insulating substrate 2 is made of a flexible film such as, for example, polyimide film, it may be replaced with a dielectric substrate such as a printed-circuit substrate made of glass epoxy or the like, or a ceramic substrate without limiting to a polyimide film. The insulating substrate 2 is preferably as thin as possible from the viewpoint of down-sizing of a semiconductor device as well. Patterning is performed on a Cu film or the like which is provided all over the surface (one surface) of the insulating substrate 2 by vapor deposition or the like technique thereon as in cases of a film substrate or a printed-circuit substrate, generally used, and Au or the like is further provided by electroplating or the like, thereby forming the wiring 21 composed of a Cu film 21a and a Au film 21b. One end of the wiring 21 is formed so as to be connected to the electrode pad 11 (bump 12) of the semiconductor chip 1 and the other end thereof is led to the central section side of the insulating substrate 2 to be connected to an external connecting terminal 22 formed in the rear surface of the insulating substrate 2 via a through hole of the insulating substrate 2.

A Sn coat 3a, as shown in an enlarged view of FIG. 1B, is further provided on the connection section of the wiring 21 with the bump 12 to a thickness of the order in the range of from 0.5 to 3 μm by means of electroless plating, sputtering or the like. The Sn coat 3a is provided only on the connection section with the bump 12. The Sn coat 3a is provided only on the connection section of the wiring 21 in a spot manner, thereby preferably enabling control of metal diffusion. On the other hand, since the Sn coat 3a is provided on the connection section and the melting point of Sn is on the order of 232° C. in contrast to the melting point of Au being on the order of 1064° C. (in a case of bonding of Au bumps therebetween, the bumps are fused to be attached to each other at a temperature of the order of 450° C. by press heating since the bumps are of the same metal), the Sn coat 3a is molten at a temperature of the order of 230° C. to form an eutectic alloy with Au into an alloy layer 3 made of an Au—Sn alloy at the bonding interface at a temperature of the order of 280° C., thereby fusing the bump 12 and the wiring 21 to be attached to each other. That is, the bump 12 and the wiring 21 can be fused to be attached to each other at a temperature low enough not to cause any inconvenience for circuit elements or the like formed in a semiconductor substrate.

While the alloy layer 3 is formed by alloying Au and Sn and if a perfect eutectic alloy is formed, the composition is 80 wt % of Au and 20 wt % of Sn, it may be allowed if all of the bonding section is not made of an eutectic alloy or a uniform alloy layer. As a result of a serious study conducted by the inventor of the present invention, it was found that no problem occurred in a bonding force if an alloy layer having 65 wt % in Au content constitutes more than one half the bonding section (in bonding area).

Connection between the semiconductor chip 1 and the insulating substrate 2 is performed in the following procedure: for example, the insulating substrate 2 is placed on a substrate stage that can be heated, the semiconductor chip 1 is positioned by a mounter such that the bump 12 and the Sn coat 3a provided at one end of the wiring 21 coincide with each other in position to heat the semiconductor chip 1 and the insulating substrate 2 to a temperature of the order of 300° C. while pressing, thereby melting the Sn coat 3a, forming the eutectic alloy with Au of the bump 12, and finally forming the alloy layer 3. Since the alloy layer 3 is in a molten state at a temperature of the order of 300° C., the bump 12 and the one end of the wiring 21 are in contact with each other in a molten state and by cease of heating, the molten state is solidified to adhere to each other.

Figure 2:
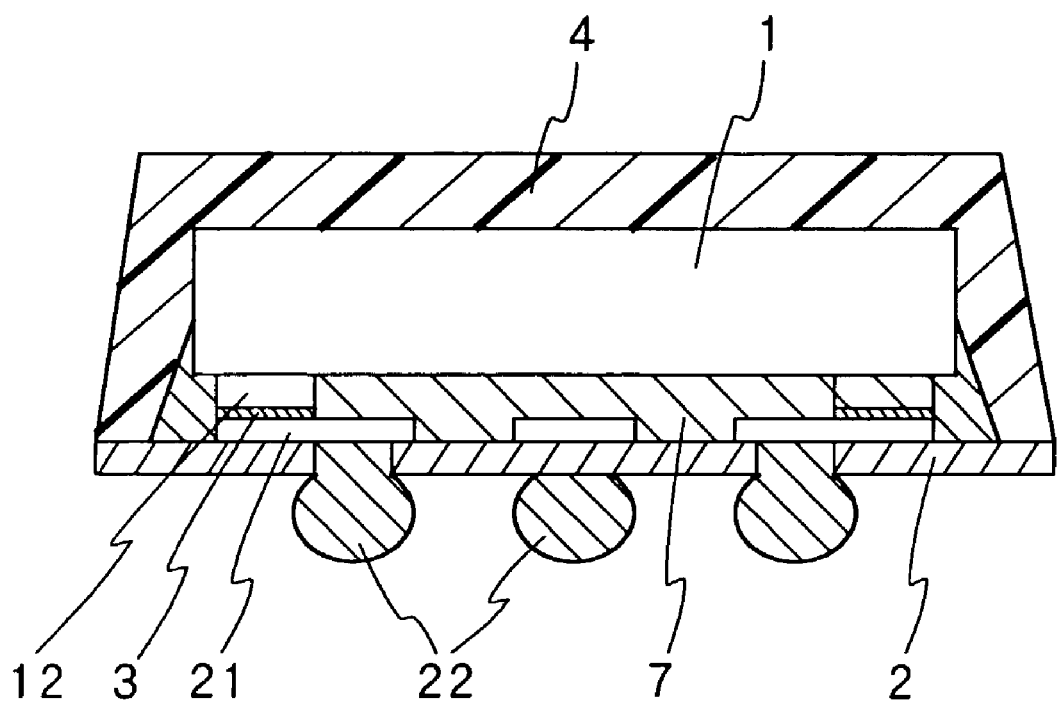
FIG. 2 is a sectional view for description of an example in which the semiconductor device shown in FIG. 1A is encapsulated into a package.
Figure 3:
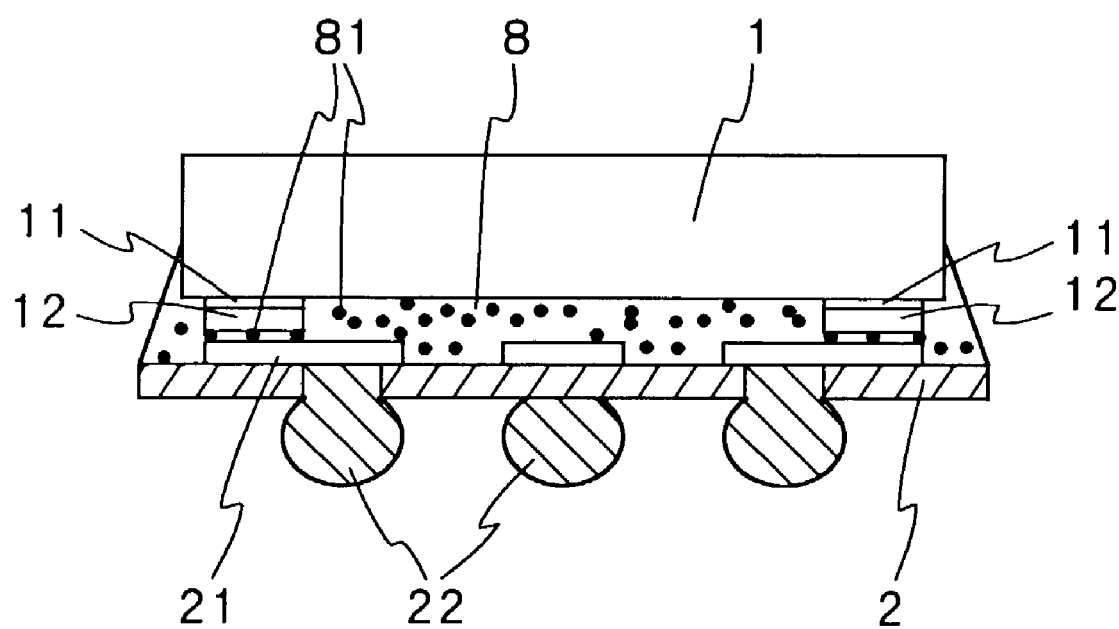
FIG. 3 is a sectional view for description showing a conventional semiconductor device of a CSP type.

Gaps between the semiconductor chip 1 and the insulating substrate 2 are filled with insulating resin 7 made of epoxy resin or elastomer to be fixedly attached to each other. While the semiconductor device in this state of being fixedly attached to each other can be used practically without any additional treatment, a package 4, as shown in FIG. 2, can also be formed by molding with epoxy resin in the semiconductor chip 1 side of the insulating substrate 2 in a similar manner to that in an ordinary fabrication of a semiconductor device. With such a shape molded, while there can be obtained a semiconductor device such as the ordinary semiconductor device shape, it is capable of mounting by soldering the external connecting terminal 22 directly onto a circuit board or the like at the connection section with a printed-circuit substrate with the help of external connecting terminals 22 distributed all over the rear surface of the semiconductor device. Note that in FIG. 2, the same reference numerals are attached to the same portions as those of FIG. 1A and descriptions thereof are not repeated.

According to the semiconductor device of the present invention, since the bump of the semiconductor chip and the wiring of the insulating substrate are caused to adhere to each other with the Au—Sn alloy layer interposing therebetween, bonding can be realized at a low temperature of the order in the range of from 280° C. to 300° C., in addition, for a short time of the order of 1 sec, which is 1/20 times that in a case where a conventional ACF is used. As a result, not only is productivity improved to a great extent, but no separation occurs at the adhesive section being caused by melting of an alloy layer either even if a temperature is raised to a value of the order of 260° C. in a case or the like where a semiconductor device is mounted to a circuit board or the like by soldering since bonding is realized by alloying. In addition, since adhesion is complete at a low temperature of the order of 300° C. for a short period, neither mechanical nor thermal stress is imposed on the semiconductor elements (circuit elements) formed in a semiconductor substrate to thereby cause no change in element characteristics altogether. Therefore, there can be attained a very high reliability semiconductor device.

On the other hand, by raising a temperature to a value of the order of 300° C. and applying an external force, easy separation therebetween is ensured. That is, while a molten portion, if any, is of a very thin layer at a temperature of solder reflow and no external force is imposed thereon; therefore no separation occurs, if a case arises where a semiconductor device is desired to be replaced, easy separation can be realized by raising a temperature to a value of the order of 300° C. under application of an external force to thereby replace the old one with a new one.

While in the example shown in FIG. 1B, the Sn coat 3a is provided on a connection section of the wiring 21, the Sn coat 3a may be formed on the surface of the bump 12 of the semiconductor chip 1. A structure may be adopted in which an Au—Sn alloy layer is provided directly on one of them without providing an Sn coat to form bonding using the alloy layer. In this case, even if no Au layer is at each of the surfaces of the bump and the wiring but with a Cu layer exposed at each of the surfaces of the bump and the wiring, Au—Sn alloy diffuses into the Cu layer and so on to be able to form a intermetallic compound into bonding. Furthermore, a structure of a semiconductor chip may be adopted in which Au plating is applied on the surface of the electrode pad 11 to cause the electrode pad and the wiring 21 to be directly bonded to each other without forming the bump 12. It is important that while Au—Sn alloy is used in bonding section to thereby ensure bonding at a low temperature, a strong bond can still be ensured at a solder reflow temperature adopted in mounting a semiconductor device.

While in the above examples, there is shown a semiconductor device of a structure in which only one semiconductor chip is bonded onto one insulating substrate, the principle of the present invention also applies to a case where two or more semiconductor chips are bonded onto one insulating substrate in a similar manner.

According to the present invention, as described above, a very short period (time) is required in bonding a semiconductor chip and an insulating substrate (film substrate) in a semiconductor device of a CSP type; therefore not only productivity is improved to a great extent, but no fear arises that an adverse influence is exerted to circuit elements formed in a semiconductor chip either since no necessity arises for imposing a pressure, thereby enabling great improvement on reliability of the semiconductor device. In addition, since circuit elements can be formed even below the electrode pad or in the vicinity thereof, it contributes to high integration.

Furthermore, since bonding is realized through a metal layer that is easily separable at 300° C. or lower, substitution of a new semiconductor chip can be performed with much of ease and simplicity without raising a temperature to an excessively high value to give damage to the device. In addition, absolutely no separation arises in a solder reflow process in mounting or the like after bonding, thereby enabling great improvement on reliability of a semiconductor chip itself and a bonding thereof.

Although preferred examples have been described in some detail it is to be understood that certain changes can be made by those skilled in the art without departing from the spirit and scope of the invention as defined by the appended claims.

The invention claimed is:

1. A semiconductor device comprising:
a semiconductor chip in which circuit elements are formed and on the periphery of which an electrode pad having a bump consisting essentially of Au thereon for connection with outside is formed;
an insulating substrate on one surface of which a wiring is formed, said wiring having an Au layer on a surface of a connecting section with said bump, and on the other surface of which a ball like external connecting terminal is formed being connected to said wiring, said ball like external connecting terminal being directly connected to a wiring board; and
a Sn coat provided on a surface of said bump or a surface of said Au layer of said wiring,
wherein said bump and said connecting section of said wiring are bonded with each other through an Au—Sn alloy layer which is made of said Sn coat and the Au of said bump or said wiring and said wiring comprises a first layer made of a Cu film and a second layer made of Au formed by electroplating on said first layer with said first layer disposed between said second layer and said insulating substrate.

2. The semiconductor device according to claim 1, wherein an intermediate metal layer is provided between said electrode pad and said bump, said intermediate metal layer comprising a first layer made of Ti or Cr and a second layer made of W, Pt, Ag, Cu or Ni.

3. The semiconductor device according to claim 1, wherein an intermediate metal layer is provided between said electrode pad and said bump, said intermediate metal layer comprising Ti—W alloy layer.

4. The semiconductor device according to claim 1, wherein said alloy layer is composed of an alloy layer containing Au at a content of 65 wt % or more.

5. The semiconductor device according to claim 1, wherein said Sn coat is provided only on a bonding section of said wiring in a spot manner.

6. The semiconductor device according to claim 1, wherein a gap between said semiconductor chip and said insulating substrate is filled with insulating resin made of epoxy resin or elastomer.

7. The semiconductor device according to claim 6, wherein there is formed a package for covering said semiconductor chip on said insulating substrate, said package made of resin.

8. The semiconductor device according to claim 1, wherein a plurality of ball like external connecting terminals, each of which is said ball like external connecting terminal, are provided, and said ball like external connecting terminals are distributed all over said insulating substrate, so that said semiconductor device is directly mounted on a wiring board while said plurality of ball like external connecting terminals are connected to wirings of said wiring board.

* * * * *